United States Patent
Jiang et al.

(10) Patent No.: US 8,487,795 B1
(45) Date of Patent: Jul. 16, 2013

(54) TIME-INTERLEAVED TRACK-AND-HOLD CIRCUIT USING DISTRIBUTED GLOBAL SINE-WAVE CLOCK

(75) Inventors: Tao Jiang, Corvallis, OR (US); Patrick Yin Chiang, Corvallis, OR (US); Freeman Y. Zhong, San Ramon, CA (US)

(73) Assignees: LSI Corporation, San Jose, CA (US); Oregon State University, Corvallis, OR (US)

( * ) Notice: Subject to any disclaimer, the term of this patent is extended or adjusted under 35 U.S.C. 154(b) by 0 days.

(21) Appl. No.: 13/450,204

(22) Filed: Apr. 18, 2012

(51) Int. Cl.
*H03M 1/00* (2006.01)

(52) U.S. Cl.
USPC ........... 341/122; 370/329; 375/232; 375/346; 375/233; 375/341; 375/229; 327/94; 327/434; 327/415; 327/91; 327/52; 341/155

(58) Field of Classification Search
USPC ........... 341/122–155; 375/229–341; 370/329; 327/91–94, 52–54, 229, 324–344, 415, 434
See application file for complete search history.

(56) References Cited

U.S. PATENT DOCUMENTS

| | | | | |
|---|---|---|---|---|
| 6,064,614 | A * | 5/2000 | Khoury | 365/207 |
| 6,829,311 | B1 * | 12/2004 | Riley | 375/326 |
| 7,778,320 | B2 * | 8/2010 | Agazzi et al. | 375/229 |
| 8,035,539 | B2 | 10/2011 | Louwsma et al. | 341/122 |
| 8,089,302 | B2 * | 1/2012 | Louwsma et al. | 327/94 |
| 8,265,134 | B2 * | 9/2012 | Agazzi et al. | 375/232 |
| 2010/0176868 | A1 | 7/2010 | Louwsma et al. | |

OTHER PUBLICATIONS

Zhiheng Cao et al., "A 32mW 1.25GS/s 6b/step SAR ADC in 0.13um CMOS," ISSCC Dig. Tech. Papers, Feb. 2008, pp. 542-543, and p. 634, Session 30/30.2, Austin, Texas.

Mohamed Dessouky et al., "Very Low-Voltage Digital-Audio ΔΣ Modulator with 88-dB Dynamic Range Using Local Switch Bootstrapping," IEEE Journal of Solid-State Circuits, Mar. 2001, pp. 349-355, vol. 36.

Manar El-Chammas et al., "A 12-GS/s 81-mW 5-bit Time Interleaved Flash ADC with Background Timing Skew Calibration," IEEE Journal of Solid-State Circuits, Apr. 2011, pp. 838-847, vol. 46, No. 4.

Yuriy M. Greshishchev et al., "A 40GS/s 6b ADC in 65 nm CMOS," ISSCC Dig. Tech Papers, Feb. 2010, pp. 390-391, Session 21/21.7, Ottawa, Canada.

(Continued)

*Primary Examiner* — Lam T Mai
(74) *Attorney, Agent, or Firm* — Otterstedt, Ellenbogen & Kammer, LLP (57) ABSTRACT

A time-interleaved track-and-hold circuit includes a clock generator adapted to receive a global sine-wave clock signal and to generate therefrom multiple square-wave output clock signals of different phases. The track-and-hold circuit includes a switching array operative in at least a track mode or a hold mode. The switching array includes multiple switch circuits, each switch circuit adapted to receive an analog input signal, a corresponding one of the output clock signals, and the global sine-wave clock signal. Each switch circuit is operative to utilize the corresponding one of the output clock signals during the track mode for tracking the analog input signal, and is operative during the hold mode to store the input signal sampled during the track mode as an output of the switch circuit and to utilize the global sine-wave clock signal during the hold mode for synchronizing sampling instants of the respective outputs of the switch circuits.

22 Claims, 4 Drawing Sheets

OTHER PUBLICATIONS

Chun-Cheng Huang et al., "A CMOS 6-Bit-GS/s Time-Interleaved ADC Using Digital Background Calibration Techniques," IEEE Journal of Solid-State Circuits, Apr. 2011, pp. 848-858, vol. 46, No. 4.

Jri Lee et al., "A 75-GHz Phase-Locked Loop in 90-nm CMOS Technology," IEEE Journal of Solid-State Circuits, Jun. 2008, pp. 1414-1426, vol. 43, No. 6.

Simon M. Louwsma et al., "A 1.35 GS/s, 10b, 175 mW Time-Interleaved AD Converter in 0.13 um CMOS," IEEE Journal of Solid-State Circuits, Apr. 2008, pp. 778-786, vol. 43, No. 4.

Ken Poulton et al., "A 4GSample/s 8b ADC in 0.35-um CMOS," ISSCC Dig. Papers, Feb. 2002, pp. 1-11, 10:1.

Ken Poulton et al., "A 20GS/s 8b ADC with a 1 MB Memory in 0.18um CMOS," ISSCC Dig. Tech Papers, Feb. 2003, pp. 1-3, Session 18/Paper 18.1.

Peter Schvan et al., "A 24GS/s 6b ADC in 90nm CMOS," ISSCC Dig. Papers, Feb. 2008, pp. 544-545, and p. 634, Session 30/30.3.

Tsung-Heng Tsai et al., "Time-Interleaved Analog-to-Digital Converters for Digital Communications," Conf. on Circuits, Signals and Systems, Nov. 2004, pp. 193-198.

Christian Vogel et al., "Time-Interleaved Analog-To-Digital Converters: Status and Future Directions," Circuits and Systems, ISCAS 2006. Proceedings. IEEE International Symposium, 2006, pp. 3386-3389, Island of Kos.

Jingguang Wang, "Techniques for Improving Timing Accuracy of Multi-Gigahertz Track/Hold Circuits," Masters Thesis, 2008, pp. 1-70, Retrieved from http://www.oregonstate.edu.

Alfio Zanchi et al., "Analysis and Characterization of the Effects of Clock Jitter in A/D Converters for Subsampling," IEEE Transactions on Circuits and Systems, Mar. 2008, pp. 522-534, vol. 55, No. 2.

* cited by examiner

TIME-INTERLEAVED TRACK-AND-HOLD CIRCUIT USING DISTRIBUTED GLOBAL SINE-WAVE CLOCK

BACKGROUND

As data communication systems reach multi-gigabit per second (Gbps) rates, the task of ensuring good signal integrity, both on-chip and off-chip, becomes increasingly important. At such high-speed data rates, clock jitter becomes a signal-integrity challenge. At the system-level behavior, for example, jitter generation, amplification and cancellation must be taken into account, with noise sources introduced from either off-chip or on-chip. The term "jitter" is often defined as the short-term variations of a periodic digital signal's significant instants (i.e., periodicity) from their ideal positions in time (see, e.g., Bell Communications Research, Inc. (Bellcore), "Synchronous Optical Network (SONET) Transport Systems: Common Generic Criteria, TR-253-CORE," Issue 2, Rev. 1, December 1997, the disclosure of which is incorporated by reference herein in its entirety for all purposes).

High-speed signaling (e.g., greater than about 25 Gbps wireline communications) requires low jitter receiver clock sampling to achieve low bit-error rate (BER). For instance, an analog-to-digital converter (ADC) operating at ultra-high speed (e.g., greater than about 10 giga-samples per second (GS/s)) typically suffers from inaccuracy of its sampling clock due to both static and dynamic timing errors. Conventional approaches to reduce static timing error in a data communication system, including, for example, the use of phase calibration in time-interleaving techniques, have resulted in increasing the complexity (e.g., through required additional circuitry or algorithms) and/or power consumption in the system, and are therefore undesirable. Furthermore, these calibration circuits may not be able to alleviate much of the dynamic timing errors introduced by high-frequency clock jitter.

SUMMARY

Principles of embodiments of the invention advantageously provide a novel architecture for reducing clock jitter in a time-interleaved track-and-hold circuit. Rather than using a square-wave clock, as is conventionally performed, the track-and-hold circuit according to embodiments of the invention employs a lower jitter global sine-wave clock for synchronizing the sampling instants of each time-interleaved ADC channel. The track-and-hold circuit according to embodiments of the invention beneficially combines the global sine-wave clock, for precisely determining the sampling instants with a low jitter clock, with time-interleaving phase clocks, for selecting the respective ADC channels, without significantly impacting circuit design complexity or power consumption.

In accordance with an embodiment of the invention, a time-interleaved track-and-hold circuit for reducing jitter in an analog-to-digital converter, including a plurality of corresponding time-interleaved analog-to-digital converter channels, includes a clock generator operative to receive a global sine-wave input clock signal and to generate therefrom multiple square-wave output clock signals, each of the output clock signals having different phases relative to one another. The track-and-hold circuit further includes a switching array operative in one of at least a track mode and a hold mode. The switching array includes multiple switch circuits, each of the switch circuits being adapted to receive an analog input signal supplied to the track-and-hold circuit, a corresponding one of the output clock signals, and the global sine-wave input clock signal. Each of the switch circuits is operative to utilize the corresponding one of the output clock signals during the track mode for tracking the analog input signal, and is operative during the hold mode to store the input signal sampled during the track mode as an output of the switch circuit and to utilize the global sine-wave input clock signal during the hold mode for synchronizing sampling instants of the respective outputs of the plurality of switch circuits.

In accordance with another embodiment of the invention, a time-interleaved data converter circuit includes a track-and-hold circuit, a plurality of ADCs, and a multiplexer. The track-and-hold circuit includes a clock generator operative to receive a global sine-wave input clock signal and to generate therefrom multiple square-wave output clock signals, each of the output clock signals having different phases relative to one another. The track-and-hold circuit further includes a switching array operative in one of at least a track mode and a hold mode. The switching array includes multiple switch circuits, each of the switch circuits being adapted to receive an analog input signal, a corresponding one of the output clock signals, and the global sine-wave input clock signal. Each of the switch circuits is operative to utilize the corresponding one of the output clock signals during the track mode for tracking the analog input signal, and is operative during the hold mode to store the input signal sampled during the track mode as an output of the switch circuit and to utilize the global sine-wave input clock signal during the hold mode for synchronizing sampling instants of the respective outputs of the plurality of switch circuits. The analog-to-digital converters are coupled to the track-and-hold circuit and arranged in parallel with one another, each of the analog-to-digital converters being operative to receive from the track-and-hold circuit a corresponding sample of the analog input signal. The multiplexer is operative to combine digital outputs generated by the respective analog-to-digital converters and to generate therefrom an output digital signal of the data converter circuit, the output digital signal being indicative of the analog input signal.

Embodiments of the invention will become apparent from the following detailed description, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the invention will be described herein in the context of illustrative time-interleaved track-and-hold circuits. It should be understood, however, that embodiments of the invention are not limited to these or any other particular circuit arrangements. While embodiments of the invention may be described herein with reference to specific clock generation circuitry and/or to specific frequencies (or frequency ranges) of operation, it is to be understood that embodiments of the invention are not limited to use with these specific circuits or frequencies, and that embodiments of the invention may be employed with other signaling circuitry and/or in other frequency ranges, as will become apparent to those skilled in the art. Moreover, it will become apparent to the skilled artisan given the teachings herein that numerous modifications can be made to the embodiments shown that are within the scope of the claimed invention. That is, no limitations with respect to the embodiments shown and described herein are intended or should be inferred.

As a preliminary matter, for the purposes of clarifying and describing embodiments of the invention, the following table (Table 1) provides a summary of certain acronyms and their corresponding definitions, as the terms are used herein:

TABLE 1

| Acronym | Definition |
| --- | --- |
| ADC | analog-to-digital converter |
| MISFET | metal-insulator-semiconductor field-effect transistor |
| MOSFET | metal-oxide-semiconductor field-effect transistor |
| NFET | n-channel field-effect transistor |
| PFET | p-channel field-effect transistor |
| NMOS | n-channel metal-oxide-semiconductor |
| PMOS | p-channel metal-oxide-semiconductor |
| CMOS | complementary metal-oxide-semiconductor |
| IC | integrated circuit |
| ENOB | effective number of bits |
| VCO | voltage-controlled oscillator |
| SNDR | signal-to-noise and distortion ratio |
| RMS | root-mean-square |
| DFF | D-type flip-flop |

The term MISFET as used herein is intended to be construed broadly and to encompass any type of metal-insulator-semiconductor field-effect transistor. The term MISFET is, for example, intended to encompass semiconductor field-effect transistors that utilize an oxide material as their gate dielectric (i.e., metal-oxide-semiconductor field-effect transistors (MOSFETs)), as well as those that do not. In addition, despite a reference to the term "metal" in the acronym MISFET, the term MISFET is also intended to encompass semiconductor field-effect transistors wherein the gate is formed from a non-metal, such as, for instance, polysilicon.

Although embodiments of the invention described herein may be implemented using p-channel MISFETs (hereinafter called "PFETs" or "PMOS" devices) and n-channel MISFETs (hereinafter called "NFETs" or "NMOS" devices), as may be formed using a complementary metal-oxide-semiconductor (CMOS) fabrication process, it is to be appreciated that embodiments of the invention are not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although embodiments of the invention are typically fabricated in a silicon wafer, embodiments of the invention can alternatively be fabricated in wafers comprising other materials, including but not limited to gallium arsenide (GaAs), indium phosphide (InP), etc.

Figure 1:
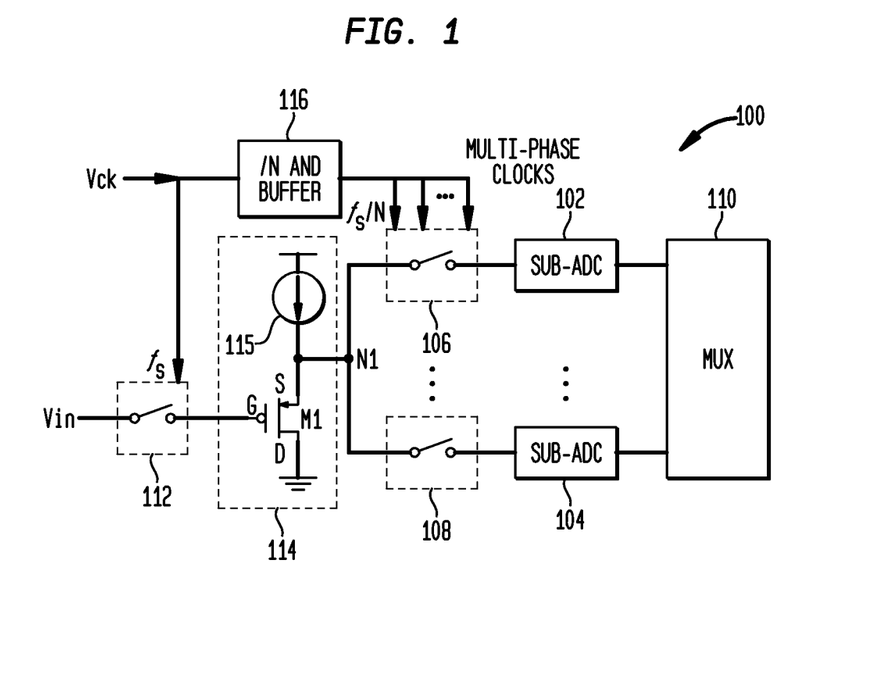
FIG. 1 is a block diagram depicting at least a portion of an illustrative time-interleaved ADC circuit, which can be modified to incorporate techniques according to embodiments of the invention.

As previously stated, a standard approach for providing clock sampling with small static timing error is to utilize time-interleaving techniques with a global track-and-hold buffer. More particularly, to achieve high resolution at speeds near and above 1 Gbps, for example, multiple ADC channels could be time-interleaved. With reference to FIG. 1, a block diagram depicts at least a portion of an illustrative time-interleaved ADC circuit 100, which can be modified to incorporate techniques according to embodiments of the invention. The ADC circuit 100 includes a plurality of subranging ADCs (sub-ADC), 102 through 104, each having an input coupled with a first terminal of corresponding switch, 106 through 108, respectively, and having an output coupled with a corresponding input of a multiplexer 110. Second terminals of the respective switches 106 through 108 are connected together at a common node, N1, adapted to receive an input signal. Each of the switches 106 through 108 is adapted to receive a corresponding control signal for selectively activating the switch.

The input signal fed to the ADCs via switches 106 through 108 is generated from an analog input signal, Vin, which is fed, via a series sampling switch 112, to a global track-and-hold buffer circuit 114. Switch 112 acts as a first-stage track-and-hold circuit that samples the input signal, Vin, with an input clock Vck. The effective signal-to-noise ratio (SNR) is critically limited by the clock jitter of the input clock Vck. Buffer circuit 114 acts, at least in part, as an isolation buffer that decouples the sampled signal seen after switch 112 from the multiple time-interleaving switches 106 through 108. A front end of the ADC circuit 100 comprising series sampling switch 112, buffer circuit 114 and switches 106 through 108 forms at least a portion of a track-and-hold circuit.

The buffer circuit 114, in this embodiment, is represented as an ideal current source 115 connected in series with a PMOS transistor M1, although the invention is not limited to this or any specific circuit configuration. More particularly, a source (S) of transistor M1 is coupled with the current source 115 at node N1, a drain (D) of M1 is adapted for connection to ground, or an alternative voltage source, and a gate (G) of M1 is connected with the switch 112 at a first terminal thereof. A second terminal of the switch 112 is adapted for receiving the input signal Vin. The switch 112 is selectively activated by a control signal, $f_s$, which is derived from an input clock signal, Vck, supplied to the ADC circuit 100.

Here, the multiple sub-ADCs are used in a parallel time-interleaved array, with each ADC 102 through 104 and corresponding switch 106 through 108, respectively, forming a separate ADC sub-channel in the array. The multiplexer 110 functions primarily to combine digital outputs of the respective ADC channels and to generate therefrom an output digital signal of the ADC circuit 100. In this structure, each time-interleaved ADC channel samples the input signal in turn. With N ADC channels operating in parallel, the overall sampling rate increases by a factor of N over that of a single channel, where N is an integer greater than one. It is to be appreciated that the invention is not limited to any specific number of ADCs, nor is the invention limited to any specific ADC configuration.

While time-interleaving provides an increased overall sampling rate, a time-interleaved arrangement generally introduces static errors due to phase misalignment and/or channel mismatch. For example, mismatches in gain, offset, and sample time among the time-interleaved ADCs 102 through 104 generate undesired spectral components and degrade the signal-to-noise and distortion ratio (SNDR) of the ADC circuit 100. These static errors due to phase misalignment (e.g., phase de-skew) and channel mismatch can be eliminated by using a global track-and-hold buffer 114 running at ultra-high frequency (e.g., about 10 GHz). In addition, the clock generator 116 is adapted to receive the input clock signal Vck and to generate the plurality of control signals for selectively activating the switches 106 through 108, with each control signal having a frequency associated therewith that is a division N of the input clock frequency. The control signals generated by clock generator 116 are time-interleaved, low-frequency phases of the input clock signal Vck. Although static errors caused by phase de-skew can be eliminated by using the high-speed buffer 114 with the global track-and-hold of switch 112, power consumption in the circuit significantly increases as the buffer 114 is running at a very high frequency and drives a large capacitive load exhibited by switches 106 through 108.

Figure 2:
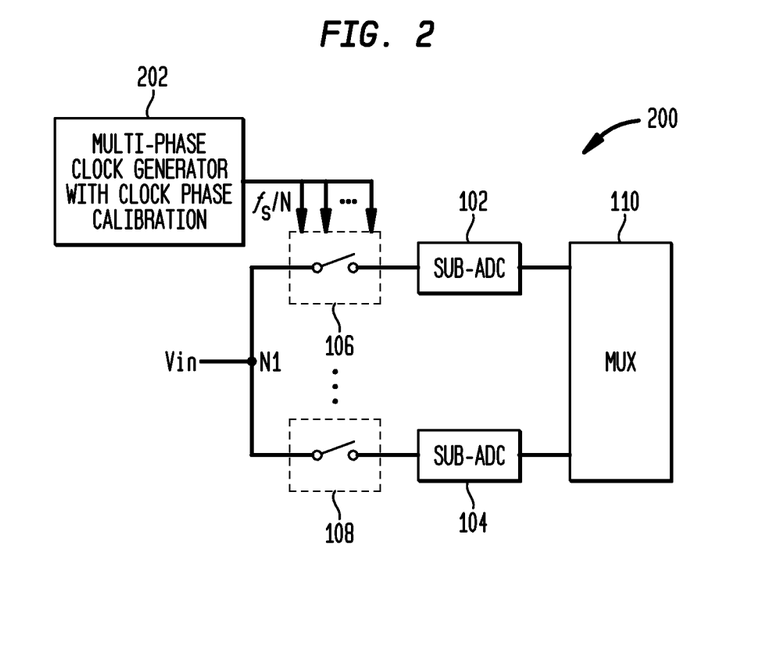
FIG. 2 is a block diagram depicting at least a portion of an illustrative time-interleaved ADC circuit which utilizes a calibration mechanism for reducing static errors.

Alternatively, rather than using the global track-and-hold buffer 114 running at ultra-high frequency, the illustrative time-interleaved track-and-hold circuit may employ complex multi-phase clocks and calibration circuitry for reducing static errors resulting from phase misalignment and/or channel mismatch. For example, FIG. 2 is a block diagram depicting at least a portion of an illustrative time-interleaved ADC circuit 200 which utilizes a calibration mechanism for reducing static errors.

Specifically, the time-interleaved ADC circuit 200 includes a plurality of subranging ADCs (sub-ADC), 102 through 104, each having an input coupled with a first terminal of corresponding switch, 106 through 108, respectively, and having an output coupled with a corresponding input of a multiplexer 110. Second terminals of the respective switches 106 through 108 are connected together at a common node, N1, adapted to receive an input signal. Each of the switches 106 through 108 is adapted to receive a corresponding control signal for selectively activating the switch. The multiple sub-ADCs are used in a parallel time-interleaved array, with each sub-ADC 102 through 104 and corresponding switch 106 through 108, respectively, forming a separate ADC sub-channel in the array. A front end of the ADC circuit 200 comprising switches 106 through 108 forms at least a portion of a track-and-hold circuit. Thus, the time-interleaved ADC circuit 200 includes an array of time-interleaved ADCs connected in manner consistent with the array of ADCs shown in FIG. 1.

The time-interleaved ADC circuit 200 further includes a multi-phase clock generator 202, which replaces the high-speed buffer 114 and front-end track-and-hold circuit 112 shown in FIG. 1. The multi-phase clock generator 202 comprises multiple-phase clock generators as well as phase calibration circuitry configured to reduce static errors resulting from phase misalignment and/or channel mismatch. However, while power consumption in the ADC circuit 200 is significantly reduced compared to the ADC circuit 100 shown in FIG. 1 by eliminating the high-speed buffer 114, such power savings comes at the expense of significantly increased circuit complexity and accompanying overhead of the multi-phase clock generator. Moreover, even if static timing errors are compensated in the multi-phase clock generator 202, dynamic timing error or clock jitter that is intrinsic or manifested due to power-supply noise cannot be avoided using the illustrative ADC circuit architecture shown in FIGS. 1 and 2.

Figure 3:
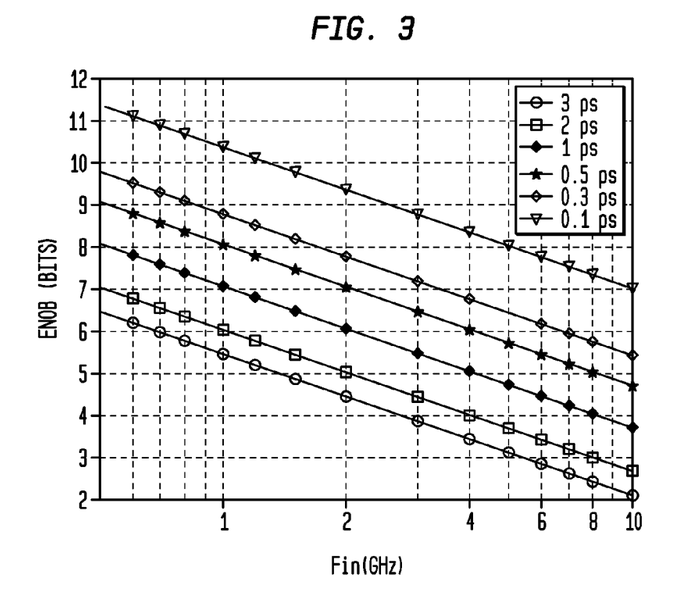
FIG. 3 is a graph conceptually depicting an effective number of bits (ENOB) versus sampling clock frequency for various jitter levels of the sampling clock.

The amount of jitter present in the sampling clock has a significant effect on the accuracy and resolution of an ADC. By way of illustration only, FIG. 3 is a graph which conceptually depicts the effective number of bits (ENOB) versus sampling clock frequency, Fin, for various levels of root-mean-square (RMS) jitter of the sampling clock. As will be known by those skilled in the art, ENOB provides an indication of the quality of an ADC; this measurement is related to the test frequency and the signal-to-noise ratio. As apparent from FIG. 3, to achieve at least 5-bit ENOB at a Nyquist frequency of 5 GHz, the RMS jitter of the sampling clock must be smaller than one picosecond (ps). Likewise, to achieve 8-bit ENOB at 5 GHz, the RMS jitter of the sampling clock must be about 0.1 ps.

Embodiments of the invention take advantage of the observation that a pure sine-wave clock, for example, a clock signal generated directly from a low-noise voltage-controlled oscillator (VCO) such as, but not limited to, an on-chip inductive-capacitive (LC) VCO, provides better jitter performance than a square-wave clock. This is due, at least in part, to the fact that the square-wave clock is typically generated by passing a sine-wave signal through an inverter stage (or an inverter-like buffer) for driving larger loads. This inverter-like buffer will introduce power supply-induced jitter, resulting primarily from fluctuations in the supply voltage, ground or voltage supply noise, etc. Furthermore, a square wave may introduce undesired spectral components, such as, for example, through gate-drain capacitive coupling. Therefore, embodiments of the invention beneficially utilize a sine-wave signal as a global clock to synchronize the sampling instants of each time-interleaved ADC channel. In this manner, a time-interleaved track-and-hold circuit in accordance with embodiments of the invention advantageously reduces the effect of phase misalignment without consuming significant power or requiring complex calibration circuitry, while exhibiting the advantages of an intrinsically low jitter sine-wave source directly.

Figure 4A:
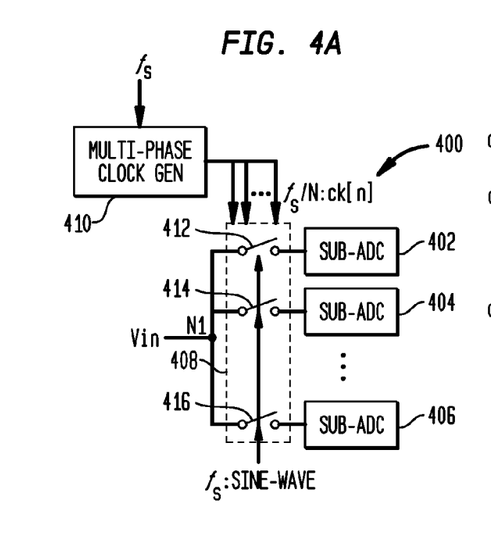
FIG. 4A is a block diagram depicting at least a portion of an exemplary time-interleaved ADC circuit, according to an embodiment of the invention.
Figure 4B:
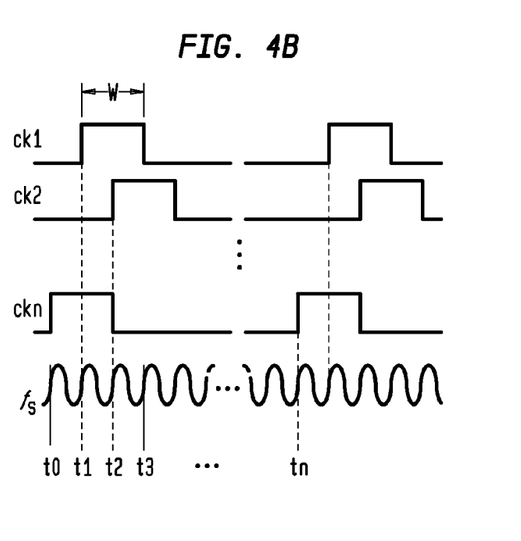
FIG. 4B depicts exemplary waveforms corresponding to certain signals associated with the illustrative ADC circuit shown in FIG. 4A.

FIG. 4A is a block diagram depicting at least a portion of an exemplary time-interleaved ADC circuit 400, according to an embodiment of the invention. FIG. 4B depicts exemplary waveforms corresponding to certain signals associated with the illustrative ADC circuit 400 shown in FIG. 4A. With reference to FIG. 4A, the time-interleaved ADC circuit 400 includes a plurality of subranging ADCs (sub-ADC), 402, 404, through 406, a switch array 408 operatively coupled with the plurality of ADCs, and a multi-phase clock generator 410. A front end of the ADC circuit 400 comprising the switch array 408 and multi-phase clock generator 410 forms at least a portion of a track-and-hold circuit. Although not explicitly shown for clarity purposes, output signals generated by the plurality of ADCs 402 through 406 are fed to a multiplexer (e.g., multiplexer 110) in a manner consistent with the ADC circuits 100 and 200 shown in FIGS. 1 and 2, respectively.

Figure 6A:
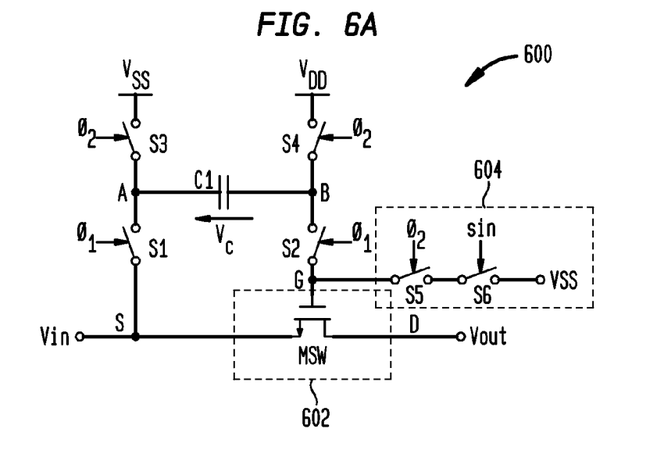
FIG. 6A is a schematic diagram depicting at least a portion of an exemplary bootstrapped switch circuit suitable for use in the illustrative ADC circuit shown in FIG. 4A, according to an embodiment of the invention.

Each of the ADCs 402 through 406 includes an input coupled with the switch array 408 and adapted to receive a time-interleaved sample of an analog input signal, Vin, supplied to the ADC circuit 400. The time-interleaving track-and-hold operation of the ADC circuit 400 is primarily a function of the switch array 408. The switch array 408, in this embodiment, comprises a plurality of switches, 412, 414, through 416, with each switch corresponding to a given one of the ADCs 402, 404, through 406, respectively. Thus, for example, if there are eight ADCs in the track-and-hold circuit 400, the switch array 408 will also include at least eight individual switches. A first node of each switch 412 through 416 is coupled with an input of a corresponding ADC 402 through 406, respectively, and second nodes of the switches are connected together at a common node, N1, and adapted to receive the analog input signal Vin. Each of the switches 412 through 416 includes a control input adapted to receive a corresponding control signal for selectively activating the switch. Moreover, each of the switches 412 through 416 in the respective time-interleaved ADC channels is adapted to receive the same sine-wave sampling clock signal, $f_s$, as will be described in further detail below in conjunction with FIG. 6. The multiple ADCs are used in a parallel time-interleaved array, with each ADC 402 through 406 and corresponding switch 412 through 416, respectively, forming a separate ADC channel in the array.

It is to be appreciated that the switches 412 through 416 are represented symbolically (e.g., single-pole-single-throw switches) for simplicity. However, these switches are, in practice, implemented as switching circuits comprising one or more transistors (e.g., NFETs and/or PFETs, boot-strapped switches, etc.) or alternative electronic switching elements (e.g. CML, differential input latches, bipolar, GaAs or InP switches, etc.), as will become apparent to those skilled in the art. Furthermore, it is to be understood that the invention is not limited to any specific number of ADCs and corresponding switches in the ADC circuit 400.

Rather than using a global square-wave clock, as is conventionally done, the ADC circuit 400 employs a lower-jitter global sine-wave clock supplied to each switch 412 through 416 to synchronize the sampling instants of each time-interleaved ADC channel, without the need for a wide-bandwidth, power-consuming global track-and-hold buffer (e.g., buffer 114 shown in FIG. 1). The ADC circuit 400 beneficially combines the global sine-wave clock, for determining low jitter sampling instants, with time-interleaving phase clocks, for selecting the respective ADC channels, without increasing circuit design complexity or power consumption.

One benefit of this approach is the ability to use a much higher frequency for the purer global sine-wave clock, while still performing sub-sampling using noisier time-interleaved multi-phase clocks. Because the sampling instants in the ADC circuit 400 are determined by the global sine-wave clock in the track-and-hold front end portion of the ADC circuit, any de-skew in the time-interleaving square-wave clocks will not affect the sampling performance, provided such skew is within an acceptable timing margin. Conventional phase calibration can be performed to align (e.g., center) the time-interleaved phase within a center of the high-frequency sine-wave clock source, thereby minimizing effects of both static and dynamic timing uncertainty of the time-interleaved phases. This approach advantageously reduces the design requirement for accuracy of the multi-phase clock generator 410, and relaxes the constraint placed on absolute jitter performance of the sine-wave clock while maintaining the Nyquist sampling rate set by the N time-interleaved phases.

Time-interleaving phase clock signals, ck1, ck2, through ckn (where n is an integer indicative of the number of ADC channels), for selectively controlling the individual switches 412, 414, through 416, respectively, in the switch array 408, are generated by the multi-phase clock generator 410. The multi-phase clock generator 410 is operative to receive the sine-wave sampling clock signal $f_s$, and to generate therefrom the respective square-wave phase clock signals ck1 through ckn. As shown in FIG. 4B, rising and falling edges of each square-wave phase clock signal are aligned with corresponding zero-crossings of the global sine-wave sampling clock signal $f_s$; a pulse width, w, of each phase clock signal, in this embodiment, is two cycles of the sampling clock, although the invention is not limited to this clocking scheme. For example, another embodiment may utilize a multi-phase clock generator comprising several stages of clock dividers, thereby generating multiple time-interleaved phases, where each individual phase is adapted to be individually adjusted for a desired phase position.

In the embodiment shown in FIGS. 4A and 4B, the phases of adjacent clock signals generated by the multi-phase clock generator 410 are delayed, relative to one another, by one cycle of the global sine-wave sampling clock signal $f_s$. More particularly, the rising edge of clock signal ck2, which occurs at time t2, is delayed from the rising edge of adjacent clock signal ck1, which occurs at time t1, by one period of the sampling clock signal $f_s$; the rising edge of clock signal ck3 (not explicitly shown), which occurs at time t3, is delayed from the rising edge of adjacent clock signal ck2 by one period of $f_s$; and so on for the remaining clock signals, with the rising edge of clock signal ck1 being delayed from the rising edge of adjacent clock signal ckn, which occurs at time t0, by one period of $f_s$. A frequency of each of the clock signals ck1 through ckn will be the frequency of the sine-wave sampling clock f divided by N, where N is the number of ADC channels in the ADC circuit 400.

Figure 5:
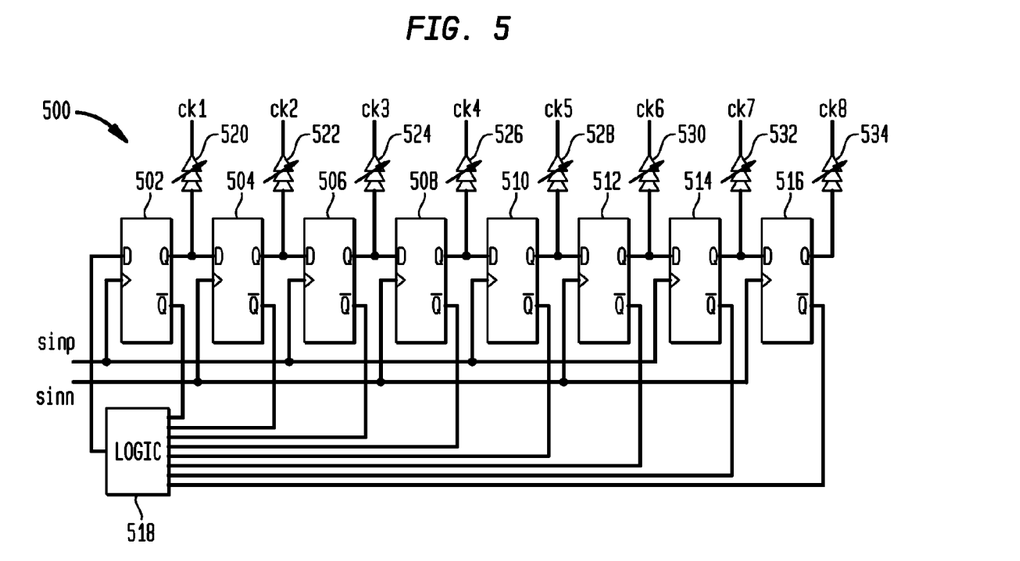
FIG. 5 is a schematic diagram depicting at least a portion of an exemplary multi-phase clock generator, suitable for use in the illustrative ADC circuit shown in FIG. 4A.

FIG. 5 is a schematic diagram depicting at least a portion of an exemplary multi-phase clock generator 500, suitable for use in the illustrative ADC circuit 400 of FIG. 4A. In this embodiment, the multi-phase clock generator 500 is an eight-phase clock generator adapted to drive an eight-channel time-interleaved ADC array, although the invention is not limited to any specific number of phases or corresponding ADC channels. The multi-phase clock generator 500 includes a plurality of D-type flip-flops (DFFs) 502, 504, 506, 508, 510, 512, 514 and 516, connected together in a cascaded configuration, each DFF being operative to generate a unique one of multiple output clock phases, ck1, ck2, ck3, ck4, ck5, ck6, ck7 and ck8, respectively. Each of the DFFs includes a data input, D, adapted to receive a data input signal, a clock input adapted to receive a clock signal, and first and second outputs, Q and Q, respectively, for generating output signals; the second output is a logical complement of the first output. The second outputs of the respective DFFs 502 through 516 are connected with corresponding input of a logic block 518.

Specifically, the data input of DFF 502 is adapted to receive an output generated by the logic block 118, the first output of DFF 502 is connected with the data input of DFF 504, the first output of DFF 504 is connected with the data input of DFF 506, the first output of DFF 506 is connected with the data input of DFF 508, the first output of DFF 508 is connected with the data input of DFF 510, the first output of DFF 510 is connected with the data input of DFF 512, the first output of DFF 512 is connected with the data input of DFF 514, and the first output of DFF 514 is connected with the data input of DFF 516. The output clock phases are generated as buffered outputs of the corresponding DFFs. More particularly, the first output of DFF 502 is passed through a first buffer stage 520 to generate the output clock phase ck1, the first output of DFF 504 is passed through a second buffer stage 522 to generate the output clock phase ck2, the first output of DFF 506 is passed through a third buffer stage 524 to generate the output clock phase ck3, the first output of DFF 508 is passed through a fourth buffer stage 526 to generate the output clock phase ck4, the first output of DFF 510 is passed through a fifth buffer stage 528 to generate the output clock phase ck5, the first output of DFF 512 is passed through a sixth buffer stage 530 to generate the output clock phase ck6, the first output of DFF 514 is passed through a seventh buffer stage 532 to generate the output clock phase ck7, and the first output of DFF 516 is passed through an eighth buffer stage 534 to generate the output clock phase ck8. Each of the respective buffer stages 520 through 534 may comprise, for example, at least one inverter, although alternative buffer circuit arrangements are similarly contemplated.

The multi-phase clock generator 500 is adapted to receive a first sine-wave clock signal, sin p, and a second sine-wave clock signal, sin n. The first and second sine-wave clock signals are shifted in phase relative to one another by 180 degrees. In alternative embodiments, the input sine-wave clock signals can be shifted in phase by something other than 180 degrees relative to one another. For example, four input sine-wave clocks (rather than two) can be used, with the phases of the respective input clock signals being shifted by 90 degrees relative to one another. In this manner, an effective real sampling rate of four times the clock frequency can be achieved. For the general case in which there are N input sine-wave clocks employed, where N is an integer, the respective input clock signals will be shifted by 360/N degrees relative to one another, so that an effective real sampling rate of N times the clock frequency can be achieved.

According to the choice of the number of DFFs and the logic, the number of the multi-phase clocks and the pulse width of each clock can be selected. The first sine-wave clock signal sin p is supplied to the clock inputs of a first subset of the DFFs, namely, DFFs 502, 506, 510 and 514, and the second sine-wave clock signal sin n is supplied to the clock inputs of a second subset of the DFFs, namely, DFFs 504, 508, 512 and 516. Thus, the sine-wave clock signals received by any two adjacent DFFs will be 180 degrees out of phase relative to one another. In this manner, each output clock pulse generated by a given DFF will be delayed from an adjacent DFF by one effective sampling clock cycle, and a duration (i.e., pulse width) of each output clock pulse will be two effective sampling clock cycles, as previously described. In the illustrative embodiment in which two sine wave clocks with 180 degree phase difference are employed (e.g., sin p and sin n), the effective global sampling rate will be twice that of the sine-wave clock; in the DFF loop comprising DFFs 502 through 516, each clock pulse will be delayed from an adjacent clock pulse by half of the sine-wave clock cycle, which is equivalent to one clock cycle of the effective sampling clock. Similarly, the pulse width will be one clock cycle of the sine-wave, but also equal to two effective sampling clock cycle. It is to be understood, however, that the invention is not limited to this particular clock phase generation arrangement.

Using the time-interleaving architecture of the ADC circuit 400, the time-interleaved phases are determined during a track phase (i.e., track mode) by the noisier square-wave clocks ck1 through ckn, while the more critical sampling instants are determined by the rising edge of the global pure, low jitter sine-wave clock, as previously stated. In this manner, timing accuracy of the ADC circuit 400 is improved from both static and dynamic timing error perspectives.

Consider, for example, that modern resonant-based inductor-capacitor (LC) oscillators can achieve jitter/phase-noise performance vastly superior to ring oscillator-based clock generators. By way of illustration only, in the paper Jri Lee, "A 75-GHz Phase-Locked Loop in 90-nm CMOS Technology," *IEEE J. Solid-State Circuits*, vol. 43, no. 6, pp. 1414-1426, June 2008, the disclosure of which is incorporated by reference herein in its entirety for all purposes, a 75-GHz phase-locked loop using on-chip resonators was shown to achieve peak-to-peak and rms jitter of 609 femtoseconds (fs), pp and 87 fs, rms, respectively. Such a sine-wave improves jitter by a factor of five times (5×) over conventional sine-wave resonator due to the high frequency of oscillation. The ADC circuit 400 is suitable for use with this sine-wave for the front-end global sampling clock, down-sampled with the lower-speed, time-interleaved multi-phase square-wave clocks.

Table 2 below provides a comparison of some illustrative ADCs in CMOS technology. Note, that most designs are limited to less than 30 dB signal-to-noise and distortion ratio (SNDR), with very large power consumption (e.g., up to about 9000 milliwatts (mW)). Here, clock jitter is a primary limitation.

TABLE 2

| Reference | Resolution [Bits] | Speed [GS/s] | Power [mW] | SNDR [dB] | Technology [nm] | FoM [pJ/conv-step] |
|---|---|---|---|---|---|---|
| [1] | 8 | 20 | 9000 | 29.5 | 180 | 18.45 |
| [2] | 6 | 24 | 1200 | 26.4 | 90 | 2.92 |
| [3] | 6 | 10.3 | 1600 | 32.4 | 90 | 4.56 |
| [4] | 6 | 40 | 1500 | 25.2 | 65 | 2.52 |
| [5] | 5 | 12 | 81 | 25.1 | 65 | 0.46 |
| [6] | 6 | 16 | 435 | 30.8 | 65 | 0.96 |

The references listed in Table 2 above, which describe details of the respective illustrative ADCs used in the comparison, are as follows: [1] S. M. Louwsma, et al., "A 1.35 GS/s, 10 b, 175 mW Time-Interleaved AD Converter in 0.13 μm CMOS," *IEEE J. Solid-State Circuits*, vol. 43, no. 4, pp. 778-786, April 2008; [2] K. Poulton, et al., "A 4 GSample/s 8-bit ADC in 0.35 μm CMOS," *ISSCC Dig. Tech. Papers*, pp. 166-167, February 2002; [3] M. El-Chammas, et al., "A 12-GS/s 81-mW 5-bit Time-Interleaved Flash ADC with Background Timing Skew Calibration," *IEEE J. Solid-State Circuits*, vol. 46, no. 4, pp. 838-847, April 2011; [4] K. Poulton, et al., "A 20 GS/s 8b ADC with a 1 MB Memory in 0.18 μm CMOS," *ISSCC Dig. Tech. Papers*, pp. 318-319, February 2003; [5] P. Schvan, et al., "A 24 GS/s 6b ADC in 90 nm CMOS," ISSCC Dig. Tech Papers, pp. 544-545, February 2008; and [6] Y. M. Greshishchev, et al., "A 40 GS/s 6b ADC in 65 nm CMOS," ISSCC Dig. Tech. Papers, pp. 390-391, February 2010; the disclosures of these references are incorporated by reference herein in their entireties for all purposes.

FIG. 6A is a schematic diagram depicting at least a portion of an exemplary bootstrapped switch circuit 600 suitable for use in the illustrative time-interleaved ADC circuit 400 shown in FIG. 4A, according to an embodiment of the invention. The switch circuit 600 is intended to depict an exemplary implementation of one of the plurality of switches 412 through 416 in the ADC circuit 400 of FIG. 4A. In FIG. 6A, $\phi_1$ and $\phi_2$ are two phases of a sampling clock signal supplied to the switch circuit 600 (which may be, for example 180 degrees apart), Vin is the analog input signal supplied to the switch array 408 in FIG. 4A, Vout is the sampled output signal supplied to the corresponding ADC with which the switch circuit 600 is connected, and VDD and VSS are the voltage supply and voltage return, respectively, for the switch circuit 600. The primary signal switch is NFET 602 (MSW), while the additional components, namely, switches S1 through S6 and capacitor C1, constitute the bootstrap circuit.

A first terminal of switch S1 is connected with a source (S) of NFET MSW and adapted to receive the analog input signal Vin, a second terminal of S1 is connected with a first terminal of switch S3 and a first terminal of capacitor C1, a control input of S1 is adapted to receive clock $\phi_1$, a second terminal of S3 is adapted for connection to VSS, and a control input of S3 is adapted to receive clock $\phi_2$. A first terminal of switch S2 is connected with a gate (G) of NFET MSW and a first terminal of switch S5, a second terminal of S2 is connected with a first terminal of switch S4 and a second terminal of capacitor C1, a control input of S2 is adapted to receive clock $\phi_1$, a second terminal of S4 is adapted for connection with VDD, and a control input of S4 is adapted to receive clock $\phi_2$. A second terminal of switch S5 is connected with a first terminal of switch S6, a control input of S5 is adapted to receive clock $\phi_2$, a second terminal of S6 is adapted for connection with VSS, and a control input of S6 is adapted to receive a global sine-wave sampling clock signal, sin. Switches S5 and S6 form at least a portion of discharge path. The sampled output signal Vout is generated at a drain (D) of NFET MSW.

Because an MOS device is symmetrical in nature, and thus bi-directional, the assignment of source and drain designations in the MOS device is essentially arbitrary. Therefore, the source and drain of a given MOS device may be referred to herein generally as first and second source/drain, respectively, with the understanding that the term "source/drain" in this context denotes a source or a drain.

In terms of operation, when clock $\phi_2$ is asserted (e.g., logic high), switches S3 and S4 will be closed and switches S1 and S2 will be open, thereby allowing capacitor C1 to charge to VDD. During $\phi_2$, switch S5 also turns on. Thus, when switch S6 is turned on, as a function of sine-wave signal sin, the gate of NFET MSW will be pulled to VSS, thereby turning off MSW. The addition of switch S6 to the discharge path 604 in the switch circuit 600 of each ADC channel, controlled by a common global sine-wave sampling clock signal sin, functions to synchronize a sampling instant of the time-interleaved ADC channels in the ADC circuit (e.g., ADC circuit 400 shown in FIG. 4A), thereby significantly improving overall jitter performance in the ADC circuit.

When clock $\phi_1$ is asserted, switches S3, S4 and S5 will be open and switches S1 and S2 will be closed, thereby connecting the precharged capacitor C1 between the gate and source of NFET MSW such that the gate-source voltage of MSW will be equal to Vc (approximately VDD) across C1. Assuming VDD is greater than a threshold voltage of NFET MSW (a likely assumption), MSW will turn on and pass the input signal Vin to the output (i.e., Vout=Vin). This switch configuration enables rail-to-rail signal switching since the gate-source voltage is always constant during $\phi_1$ independently of the input signal Vin.

Figure 6B:
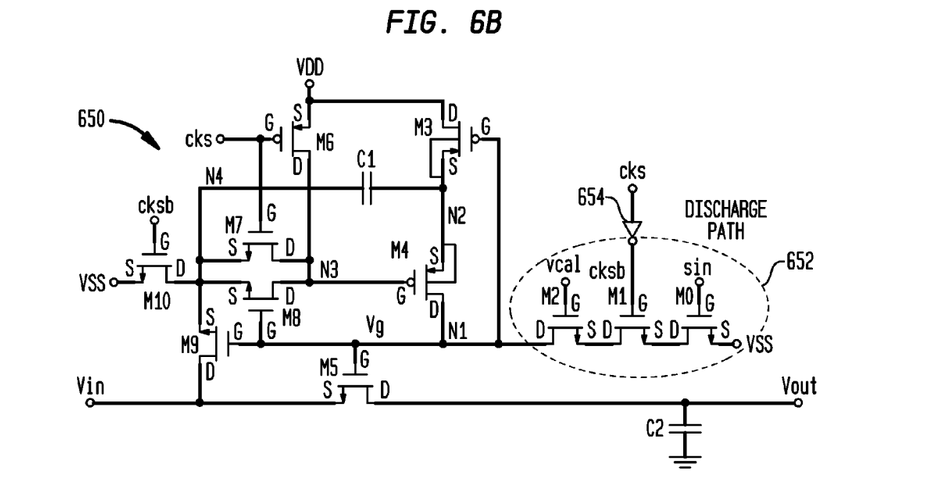
FIG. 6B is a schematic diagram depicting an exemplary transistor-level implementation of the illustrative bootstrapped switch circuit shown in FIG. 6A, according to an embodiment of the invention.

FIG. 6B is a schematic diagram depicting an exemplary transistor-level implementation 650 of the illustrative bootstrapped switch circuit 600 shown in FIG. 6A, according to an embodiment of the invention. In FIG. 6B, signal cks is one of the phases of the time-interleaved clocks, which may be equivalent clock $\phi_1$, generated by the multi-phase clock generator 410 in FIG. 4A, or alternative clock generation circuitry, and signal cksb is the complement of the clock signal cks. The exemplary switch circuit 650 includes a plurality of NFETs, M0, M1, M2, M5, M7, M8, M9 and M10, and a plurality of PFETs, M3, M4 and M6. A source of NFET M0 is adapted for connection with VSS (e.g., ground), a drain of M0 is connected with a source of NFET M1, and a gate of M0 is adapted to receive a global sine-wave sampling clock signal, sin. A drain of NFET M1 is connected with a source of NFET M2, and a gate of M1 is adapted to receive the clock signal cksb, which is a logical complement of clock signal cks generated by an inverter 654, or an alternative inverting buffer. A drain of NFET M2 is coupled with a gate of PFET M3 and a drain of PFET M4 at node N1, and a gate of M2 is adapted to receive a control signal, vcal, which is used in this embodiment, in conjunction with M2, as part of an optional calibration mechanism to compensate for process variation and mismatch between time-interleaved ADC channels. NFETs M0, M1 and M2 form a discharge path 652 for selectively discharging node N1 to VSS.

An important aspect of embodiments of the invention is the addition of a transistor (an NFET in this embodiment, although the invention is not limited to an NFET device) M0 in the discharge path 652 which is gated by the global sine-wave clock signal sin. This same sine-wave clock is similarly used to gate a corresponding transistor in the discharge paths of each of the respective switch circuits (e.g., switches 412 through 416 in FIG. 4A) in the time-interleaved ADC channels. As long as the rising edge of the clock signal cksb arrives earlier than that of the global sine-wave clock signal sin, then the cut-off point will be determined by the global sine-wave clock. In this manner, transistor M0 in each of the switch circuits in the track-and-hold circuit functions to synchronize the sampling instants of the respective ADC channels with the global sine clock, as previously stated.

It is to be appreciated that the track-and-hold portion of the ADC circuit (e.g., circuit 400 in FIG. 4A) in which the switch circuit 650 is employed, by design, is able to account for phase error between each of the multi-phase clocks, and therefore complicated phase calibration circuitry may not be required. However, the inclusion of transistor M2 (in this embodiment, an NFET) and corresponding calibration voltage vcal further enhances the performance of the circuit, since it will affect the sampling instant in each time-interleaved ADC channel if there is a mismatch in process technology (being part of the discharge path 652). For example, if the threshold voltages associated with transistors M0, M1, and M2 in different time-interleaved ADC channels are not substantially the same, the sampling instants will also be slightly shifted relative to one another, and that can affect overall performance. Thus, to compensate for this potential mismatch, transistor M2 and its corresponding voltage vcal are beneficially used to control (i.e., "tune") an on-resistance of M2, thereby controlling a resistor-capacitor (RC) delay of the overall discharge path 652 from node N1 to VSS. This calibration voltage vcal can be generated, for example, by using a standard DC reference voltage generator, such as, but not limited to, a resistive ladder or other low-power digital-to-analog converter (DAC), to generate the voltage vcal. Since channel mismatch and process variation generally cannot be predicted with sufficient accuracy, the use of such a simple calibration scheme enhances the performance of the track-and-hold circuit in which the switch circuit 650 is employed, without significantly increasing power consumption or circuit complexity. Another embodiment for calibrating the sampling instant is to insert a variable capacitance or current source into the node N1, or similarly, changing a time constant for the sampling instant that "cuts-off" switch M5.

With continued reference to FIG. 6B, a drain of PFET M3 is adapted for connection with VDD, a gate of M3 is connected with node N1, a source of M3 and a source of PFET M4 is connected with a first terminal of a first capacitor C1 at node N2, a drain of M4 is connected with node N1, and a gate of M4 is connected with drains of PFET M6 and NFETs M7 and M8 at node N3. It should be noted that the respective bulks of transistors M3 and M4 are connected to the highest potential, i.e., node N2, and not to VDD. A source of M6 is adapted for connection with VDD, gates of M6 and M7 are adapted to receive the clock signal cks, and sources of M7, M8 and NFET M9 and a second terminal of capacitor C1 are connected together at node N4. Gates of M8, M9 and NFET M5 are connected with node N1, a drain of M9 is connected with a source of M5 and adapted to receive the input signal Vin, a drain of M5 is connected with a first terminal of a second capacitor C2 and operative to generate the output signal Vout, and a second terminal of capacitor C2 is adapted for connection with ground or VSS. The capacitor C2 functions, at least in part, to temporarily store a value of the sampled input signal as the output signal Vout during the hold mode of operation. A drain of NFET M10 is connected with node N4, a gate of M10 is adapted to receive the clock signal cksb, and a source of M10 is adapted for connection with VSS.

The switch circuit 650 is an implementation of a symmetrical bootstrapped switch, according to an embodiment of the invention. Comparing FIGS. 6A and 6B, NFET M5 in FIG. 6B corresponds to primary switching NFET MSW in FIG. 6A, NFET M9 corresponds to switch S1, PFET M4 corresponds to switch S2, NFET M10 corresponds to switch S3, PFET M3 corresponds to switch S4, NFET M1 corresponds to switch S5, and NFET M0 corresponds to switch S6. The remaining transistors, namely, PFET M6, and NFETs M7 and M8, and modified connectivity of switch circuit 650 are introduced to provide all switch operation from rail-to-rail while limiting the gate-source voltage on any transistor to VDD to reduce voltage stress on the transistors. For example, gate connections of transistor M3 and M4 prevent their overstress as the voltage on node N2 rises above VDD. Transistor M7 turns on transistor M4 on the rising edge of clock signal cks, while transistor M8 keeps M4 turned on as the voltage on node N4 rises to the voltage of the input signal Vin. Gate connections of transistors M8 and M9 allow M8 and M9 to be turned on similar to the main switching transistor M5.

In addition to providing the ability to adjust for mismatch between time-interleaved ADC channels, as described herein above, transistor M2 further prevents the gate-drain voltage of transistor M1 from exceeding VDD when clock signal cks is asserted (e.g., logic high). Specifically, when the clock signal cks is asserted, the clock signal cksb supplied to the gate of transistor M1 will be a logic low, thereby turning off M1. When transistor M1 is off, its drain-bulk diode junction voltage reaches a reverse bias voltage of 2VDD. This should be compatible with prescribed technology limits.

By way of example only and without loss of generality, consider a 12 GS/s 8-channel ADC circuit in which aspects according to embodiments of the invention are employed. As observed from exemplary circuit simulation results, when there is no sine-wave modulation (that is, the gate of transistor M0 in switch circuit 650 is shorted to VDD instead of applying the global sine-wave clock signal sin in FIG. 6B), the ADC circuit can only achieve a signal-to-noise ratio of about 28 dB at the Nyquist input frequency, with phase de-skew in each channel no larger than about 4 ps. Alternatively, the ADC circuit incorporating switch circuit 650 with sine-wave modulation (that is, the global sine-wave clock signal sin is supplied to the gate of transistor M0 in switch circuit 650 in FIG. 6B) can achieve a signal-to-noise ratio of about 40 dB under the same operating conditions.

Figure 7:
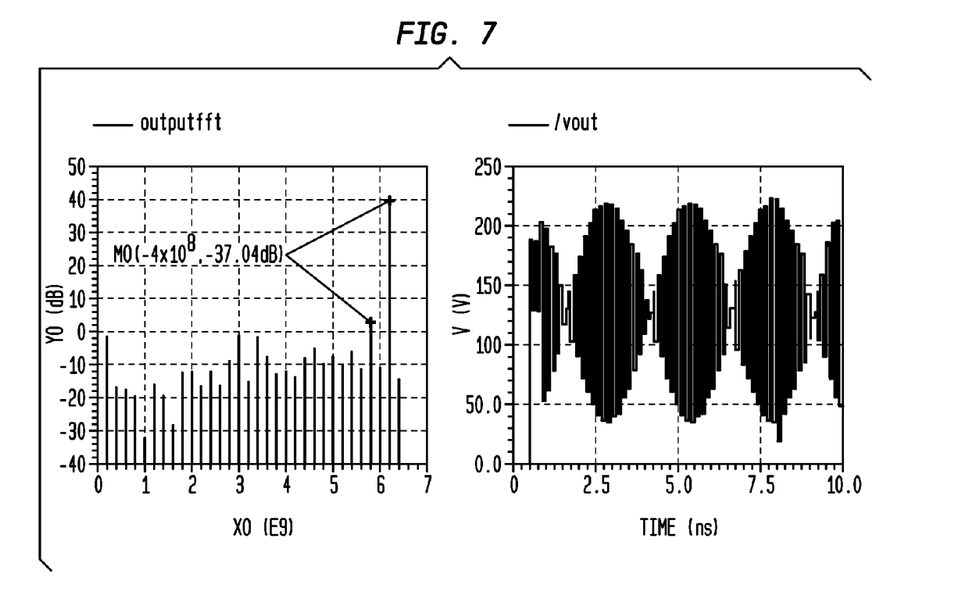
FIG. 7 graphically depicts simulated post-layout performance results corresponding to an exemplary implementation of a time-interleaved track-and-hold circuit with global sine-wave sampling, according to an embodiment of the invention.

FIG. 7 graphically depicts simulated post-layout performance results corresponding to an exemplary implementation of a time-interleaved ADC circuit (e.g., ADC circuit 400 shown in FIG. 4A) comprising switch circuits 650 shown in FIG. 6B, according to an embodiment of the invention. The 8-channel time-interleaved ADC circuit is driven differentially by two complementary sine-wave clocks having a frequency of 6 GHz, so that the overall sampling rate is 12 GS/s, while the frequency of the input signal is near the Nyquist rate of 6 GHz. In this simulation, a certain amount (e.g., up to 4 ps in each channel) of phase error is deliberately introduced. Such phase difference can be achieved by coarse adjustment with little circuit complexity and/or power consumption. Besides, a dynamic jitter of RMS 600 fs for the sine-wave clock is also assumed, which is achievable by directly using sine-wave clocks in the real circuits. As apparent from FIG. 7, the ADC circuit which incorporates techniques in accordance with embodiments of the invention achieves improved SNDR.

At least a portion of the techniques of the embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with embodiments of the invention can be employed in essentially any application and/or electronic system in which ADC circuits may be employed. Suitable systems for implementing techniques of embodiments of the invention may include, but are not limited to, data processors, personal computers, mobile phones, multimedia systems, data communication systems, etc. Systems incorporating such integrated circuits are considered part of embodiments of the invention. Given the teachings of embodiments of the invention provided herein, one of ordinary skill in the art will be able to contemplate other implementations and applications of the techniques of embodiments of the invention.

The illustrations of embodiments of the invention described herein are intended to provide a general understanding of the architecture of various embodiments of the invention, and they are not intended to serve as a complete description of all the elements and features of apparatus and systems that might make use of the architectures and circuits according to embodiments of the invention described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the inventive subject matter are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A time-interleaved track-and-hold circuit for reducing jitter in an analog-to-digital converter including a plurality of corresponding time-interleaved analog-to-digital converter channels, the track-and-hold circuit comprising:
a clock generator operative to receive a global sine-wave input clock signal and to generate therefrom a plurality of square-wave output clock signals, each of the output clock signals having different phases relative to one another; and
a switching array operative in one of at least a track mode and a hold mode, the switching array comprising a plurality of switch circuits, each of the switch circuits being adapted to receive an analog input signal supplied to the track-and-hold circuit, a corresponding one of the output clock signals, and the global sine-wave input clock signal, each of the switch circuits being operative to utilize the corresponding one of the output clock signals during the track mode for tracking the analog input signal, and being operative during the hold mode to store the input signal sampled during the track mode as an output of the switch circuit and to utilize the global sine-wave input clock signal during the hold mode for synchronizing sampling instants of the respective outputs of the plurality of switch circuits.

2. The track-and-hold circuit of claim 1, wherein the clock generator comprises a plurality of D-type flip-flops connected together in a cascaded arrangement, such that an output generated by a given one of the flip-flops is connected with an input of a subsequent adjacent one of the flip-flops, and an input of a first one of the flip-flops is adapted to receive a signal generated as a function of each of at least a subset of the respective outputs of the flip-flops.

3. The track-and-hold circuit of claim 2, wherein for any two adjacent flip-flops in the plurality of flip-flops, a first one of the adjacent flip-flops is adapted to receive, as a clock signal, the global sine-wave input clock signal and a second one of the adjacent flip-flops is adapted to receive, as a clock signal, a version of the global sine-wave input clock signal that is shifted in phase by a prescribed amount.

4. The track-and-hold circuit of claim 2, wherein each of the plurality of flip-flops is operative to generate a unique one of the plurality of square-wave output clock signals.

5. The track-and-hold circuit of claim 2, wherein the clock generator further comprises logic circuitry including a plurality of inputs, each input being adapted to receive a corresponding one of the outputs of the flip-flops, the logic circuitry being operative to generate the signal received by the first one of the flip-flops.

6. The track-and-hold circuit of claim 1, wherein each of the plurality of switch circuits comprises:
a capacitor;
a first field-effect transistor having a first source/drain adapted to receive the analog input signal and a second source/drain forming an output of the switch circuit and operative to generate the sampled output of the switch circuit;
at least first, second, third and fourth switches, the first switch being coupled between a first voltage supply and a first node of the capacitor, the second switch being coupled between a second voltage supply and a second node of the capacitor, the third switch being coupled between the first node of the capacitor and a gate of the first field-effect transistor, and the fourth switch being coupled between the second node of the capacitor and the first source/drain of the first field-effect transistor, the third and fourth switches being adapted to receive a corresponding one of the output clock signals as a control signal, and the first and second switches being adapted to receive a logical complement of the corresponding one of the output clock signals; and
a discharge circuit coupled between the gate of the first field-effect transistor and the second voltage supply, the discharge circuit being adapted to receive at least the corresponding one of the output clock signals and the global sine-wave input clock signal and being operative to turn off the first field-effect transistor during the hold mode as a function of at least the corresponding one of the output clock signals and the global sine-wave input clock signal.

7. The track-and-hold circuit of claim 6, wherein the discharge circuit comprises a calibration circuit connected in series between the gate of the first field-effect transistor and the second voltage supply, the calibration circuit being adapted to receive a control signal, a delay associated with the discharge circuit being controlled as a function of the control signal for controlling a sampling instant associated with the sampled output of the switch circuit to thereby control a mismatch between sampling instants of the respective switch circuits in the switching array.

8. The track-and-hold circuit of claim 7, wherein the calibration circuit includes at least a second field-effect transistor having a first source/drain connected with the gate of the first field-effect transistor, a second source/drain connected in series with the second voltage supply, and a gate adapted to receive the control signal.

9. The track-and-hold circuit of claim 6, wherein the discharge circuit comprises at least second, third and fourth field-effect transistors, a first source/drain of the second field-effect transistor being adapted for connection with the second voltage supply, a second source/drain of the second field-effect transistor connected with a first source/drain of the third field-effect transistor, a gate of the second field-effect transistor being adapted to receive the global sine-wave input clock signal, a second source/drain of the third field-effect transistor connected with a first source/drain of the fourth field-effect transistor, a gate of the third field-effect transistor being adapted to receive the corresponding one of the output clock signals, a second source/drain of the fourth field-effect transistor connected with the gate of the first field-effect transistor, and a gate of the fourth field-effect transistor being adapted to receive a calibration signal, wherein a delay of the discharge circuit is controlled as a function of a level of the calibration signal to thereby control a mismatch between sampling instants of the respective switch circuits in the switching array.

10. The track-and-hold circuit of claim 1, wherein each of the plurality of switch circuits comprises:
a capacitor;
first, second and third p-channel field-effect transistors (PFETs) and first, second, third, fourth and fifth n-channel field-effect transistor (NFETs), a first source/drain of the first NFET being adapted to receive the analog input signal and a second source/drain of the first NFET forming an output of the switch circuit and being operative to generate the sampled output of the switch circuit, a first source/drain of the first and third PFETs being adapted for connection with a first voltage supply, a second source/drain of the first PFET being connected with a first node of the capacitor and a first source/drain of the second PFET, a second source/drain of the third PFET being connected with a first source/drain of the second and third NFETs and a gate of the second PFET, a gate of the first PFET being connected with a gate of the first, third and fourth NFETs and a second source/drain of the second PFET, a gate of the third PFET being connected with a gate of the second NFET and adapted to receive the corresponding one of the output clock signals, a second node of the capacitor being connected with a second source/drain of the second and third NFETs, and a first source/drain of the fourth and fifth NFETs, a second source/drain of the fourth NFET being connected with the first source/drain of the first NFET, a second source/drain of the fifth NFET being adapted for connection with the second voltage supply, and a gate of the fifth NFET being adapted to receive a logical complement of the corresponding one of the output clock signals; and
a discharge circuit coupled between the gate of the first NFET and the second voltage supply, the discharge circuit being adapted to receive at least the corresponding one of the output clock signals and the global sine-wave input clock signal and being operative to turn off the first field-effect transistor during the hold mode as a function of at least the corresponding one of the output clock signals and the global sine-wave input clock signal.

11. The track-and-hold circuit of claim 10, wherein the discharge circuit comprises a calibration circuit connected in series between the gate of the first field-effect transistor and the second voltage supply, the calibration circuit being adapted to receive a control signal, a delay associated with the discharge circuit being controlled as a function of the control signal for controlling a sampling instant of the sampled output of the switch circuit to thereby control a mismatch between the respective switch circuits in the switching array.

12. The track-and-hold circuit of claim 11, wherein the calibration circuit includes at least a sixth NFET having a first source/drain connected with the gate of the first NFET, a second source/drain coupled in series with the second voltage supply, and a gate adapted to receive the control signal.

13. A time-interleaved data converter circuit, comprising:
a track-and-hold circuit comprising:
a clock generator operative to receive a global sine-wave input clock signal and to generate therefrom a plurality of square-wave output clock signals, each of the output clock signals having different phases relative to one another; and
a switching array operative in one of at least a track mode and a hold mode, the switching array comprising a plurality of switch circuits, each of the switch circuits being adapted to receive an analog input signal, a corresponding one of the output clock signals, and the global sine-wave input clock signal, each of the switch circuits being operative to utilize the corresponding one of the output clock signals during the track mode for tracking the analog input signal, and being operative during the hold mode to store the input signal sampled during the track mode as an output of the switch circuit and to utilize the global sine-wave input clock signal during the hold mode for synchronizing sampling instants of the respective outputs of the plurality of switch circuits;
a plurality of analog-to-digital converters arranged in parallel with one another, the analog-to-digital converters being coupled with the track-and-hold circuit, each of the analog-to-digital converters being operative to receive from the track-and-hold circuit a corresponding sample of the analog input signal; and
a multiplexer operative to combine digital outputs generated by the respective analog-to-digital converters and to generate therefrom an output digital signal of the data converter circuit, the output digital signal being indicative of the analog input signal.

14. The data converter circuit of claim 13, wherein each of the plurality of switch circuits in the track-and-hold circuit comprises:
a capacitor;
a first field-effect transistor having a first source/drain adapted to receive the analog input signal and a second source/drain forming an output of the switch circuit and operative to generate the sampled output of the switch circuit;
at least first, second, third and fourth switches, the first switch being coupled between a first voltage supply and a first node of the capacitor, the second switch being coupled between a second voltage supply and a second node of the capacitor, the third switch being coupled between the first node of the capacitor and a gate of the first field-effect transistor, and the fourth switch being coupled between the second node of the capacitor and the first source/drain of the first field-effect transistor, the third and fourth switches being adapted to receive a corresponding one of the output clock signals as a control signal, and the first and second switches being adapted to receive a logical complement of the corresponding one of the output clock signals; and
a discharge circuit coupled between the gate of the first field-effect transistor and the second voltage supply, the discharge circuit being adapted to receive at least the corresponding one of the output clock signals and the global sine-wave input clock signal and being operative to turn off the first field-effect transistor during the hold mode as a function of at least the corresponding one of the output clock signals and the global sine-wave input clock signal.

15. The data converter circuit of claim 14, wherein the discharge circuit comprises a calibration circuit connected in series between the gate of the first field-effect transistor and the second voltage supply, the calibration circuit being adapted to receive a control signal, a delay associated with the discharge circuit being controlled as a function of the control signal for controlling a sampling instant associated with the sampled output of the switch circuit to thereby control a mismatch between sampling instants of the respective switch circuits in the switching array.

16. The data converter circuit of claim 15, wherein the calibration circuit includes at least a second field-effect transistor having a first source/drain connected with the gate of the first field-effect transistor, a second source/drain connected in series with the second voltage supply, and a gate adapted to receive the control signal.

17. The data converter circuit of claim 14, wherein the discharge circuit comprises at least second, third and fourth field-effect transistors, a first source/drain of the second field-effect transistor being adapted for connection with the second voltage supply, a second source/drain of the second field-effect transistor connected with a first source/drain of the third field-effect transistor, a gate of the second field-effect transistor being adapted to receive the global sine-wave input clock signal, a second source/drain of the third field-effect transistor connected with a first source/drain of the fourth field-effect transistor, a gate of the third field-effect transistor being adapted to receive the corresponding one of the output clock signals, a second source/drain of the fourth field-effect transistor connected with the gate of the first field-effect transistor, and a gate of the fourth field-effect transistor being adapted to receive a calibration signal, wherein a delay of the discharge circuit is controlled as a function of a level of the calibration signal to thereby control a mismatch between sampling instants of the respective switch circuits in the switching array.

18. The data converter circuit of claim 13, wherein each of the plurality of switch circuits in the track-and-hold circuit comprises:
    a capacitor;
    first, second and third p-channel field-effect transistors (PFETs) and first, second, third, fourth and fifth n-channel field-effect transistor (NFETs), a first source/drain of the first NFET being adapted to receive the analog input signal and a second source/drain of the first NFET forming an output of the switch circuit and being operative to generate the sampled output of the switch circuit, a first source/drain of the first and third PFETs being adapted for connection with a first voltage supply, a second source/drain of the first PFET being connected with a first node of the capacitor and a first source/drain of the second PFET, a second source/drain of the third PFET being connected with a first source/drain of the second and third NFETs and a gate of the second PFET, a gate of the first PFET being connected with a gate of the first, third and fourth NFETs and a second source/drain of the second PFET, a gate of the third PFET being connected with a gate of the second NFET and adapted to receive the corresponding one of the output clock signals, a second node of the capacitor being connected with a second source/drain of the second and third NFETs, and a first source/drain of the fourth and fifth NFETs, a second source/drain of the fourth NFET being connected with the first source/drain of the first NFET, a second source/drain of the fifth NFET being adapted for connection with the second voltage supply, and a gate of the fifth NFET being adapted to receive a logical complement of the corresponding one of the output clock signals; and
    a discharge circuit coupled between the gate of the first NFET and the second voltage supply, the discharge circuit being adapted to receive at least the corresponding one of the output clock signals and the global sine-wave input clock signal and being operative to turn off the first field-effect transistor during the hold mode as a function of at least the corresponding one of the output clock signals and the global sine-wave input clock signal.

19. The data converter circuit of claim 18, wherein the discharge circuit comprises a calibration circuit connected in series between the gate of the first field-effect transistor and the second voltage supply, the calibration circuit being adapted to receive a control signal, a delay associated with the discharge circuit being controlled as a function of the control signal for controlling a sampling instant of the sampled output of the switch circuit to thereby control a mismatch between the respective switch circuits in the switching array.

20. The data converter circuit of claim 19, wherein the calibration circuit includes at least a sixth NFET having a first source/drain connected with the gate of the first NFET, a second source/drain coupled in series with the second voltage supply, and a gate adapted to receive the control signal.

21. An integrated circuit including at least one time-interleaved track-and-hold circuit for reducing jitter in an analog-to-digital converter including a plurality of corresponding time-interleaved analog-to-digital converter channels, the at least one track-and-hold circuit comprising:
    a clock generator operative to receive a global sine-wave input clock signal and to generate therefrom a plurality of square-wave output clock signals, each of the output clock signals having different phases relative to one another; and
    a switching array operative in one of at least a track mode and a hold mode, the switching array comprising a plurality of switch circuits, each of the switch circuits being adapted to receive an analog input signal supplied to the at least one track-and-hold circuit, a corresponding one of the output clock signals, and the global sine-wave input clock signal, each of the switch circuits being operative to utilize the corresponding one of the output clock signals during the track mode for tracking the analog input signal, and being operative during the hold mode to store the input signal sampled during the track mode as an output of the switch circuit and to utilize the global sine-wave input clock signal during the hold mode for synchronizing sampling instants of the respective outputs of the plurality of switch circuits.

22. An electronic system, comprising:
    at least one time-interleaved data converter circuit, the at least one data converter circuit comprising:
        a track-and-hold circuit comprising:
            a clock generator operative to receive a global sine-wave input clock signal and to generate therefrom a plurality of square-wave output clock signals, each of the output clock signals having different phases relative to one another; and
            a switching array operative in one of at least a track mode and a hold mode, the switching array comprising a plurality of switch circuits, each of the switch circuits being adapted to receive an analog input signal, a corresponding one of the output clock signals, and the global sine-wave input clock signal, each of the switch circuits being operative to utilize the corresponding one of the output clock signals during the track mode for tracking the analog input signal, and being operative during the hold mode to store the input signal sampled during the track mode as an output of the switch circuit and to utilize the global sine-wave input clock signal during the hold mode for synchronizing sampling instants of the respective outputs of the plurality of switch circuits;

a plurality of analog-to-digital converters arranged in parallel with one another, the analog-to-digital converters being coupled with the track-and-hold circuit, each of the analog-to-digital converters being operative to receive from the track-and-hold circuit a corresponding sample of the analog input signal; and a multiplexer operative to combine digital outputs generated by the respective analog-to-digital converters and to generate therefrom an output digital signal of the data converter circuit, the output digital signal being indicative of the analog input signal.

\* \* \* \* \*